United States Patent
Aleshin et al.

(10) Patent No.: US 6,197,456 B1
(45) Date of Patent: Mar. 6, 2001

(54) MASK HAVING AN ARBITRARY COMPLEX TRANSMISSION FUNCTION

(75) Inventors: Stanislav V. Aleshin; Genadij V. Belokopitov, both of Moscow (RU); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/233,828

(22) Filed: Jan. 19, 1999

(51) Int. Cl.[7] .................................................. G03F 9/00
(52) U.S. Cl. .................................................................. 430/5
(58) Field of Search ............................... 430/5, 322, 324; 428/432

(56) References Cited

U.S. PATENT DOCUMENTS

| | | | |
|---|---|---|---|
| 4,652,134 | 3/1987 | Pasch et al. | 356/401 |
| 5,444,265 | 8/1995 | Hamilton | 250/559 |
| 5,527,645 | 6/1996 | Pati et al. | 430/5 |
| 5,595,861 | 1/1997 | Garza | 430/510 |
| 5,663,076 | 9/1997 | Rostoker et al. | 438/14 |
| 5,679,598 | 10/1997 | Yee | 437/60 |
| 5,705,301 | 1/1998 | Garza et al. | 430/5 |
| 5,744,268 | 4/1998 | Nakao | 430/5 |
| 5,759,724 | 6/1998 | Rolson | 430/5 |
| 5,840,447 | 11/1998 | Peng | 430/5 |
| 5,866,280 | 2/1999 | Ito et al. | 430/5 |
| 5,985,492 | 11/1999 | Wheeler et al. | 430/5 |
| 5,998,069 | 12/1999 | Cutter et al. | 430/5 |

OTHER PUBLICATIONS

Marc D. Levenson et al., "Improving Resolution in Photolithography with a Phase–Shifting Mask,"IEEE Transactions on Electron Devices, vol. ED–29, No. 12, pp. 1828–1836, Dec. 1982.

Stephen A. Campbell, "The Science and Engineering of Microelectronic Fabrication," Oxford University Press, pp. 173–175, 1996.

International Search Report for PCT/US00/01549 dated Apr. 3, 2000.

*Primary Examiner*—S. Rosasco

(57) ABSTRACT

A mask is provided which has a complex transmission function and which includes a transparent layer and a non-transparent layer. The transparent layer has three types of phase-shifting elements, each imparting a different phase shift relative to the others, with the phase-shifting elements alternating in both x and y dimensions. The non-transparent layer has holes arranged in an approximately equally spaced grid pattern defined by common points in borders of the phase-shifting elements. Centers of at least two holes in the non-transparent layer have different offsets from their corresponding common points. Also provided is a mask blank which includes a transparent layer and a non-transparent layer. The transparent layer has three types of phase-shifting elements, each imparting a different phase shift relative to the others, with the phase-shifting elements alternating in both x and y dimensions.

29 Claims, 3 Drawing Sheets

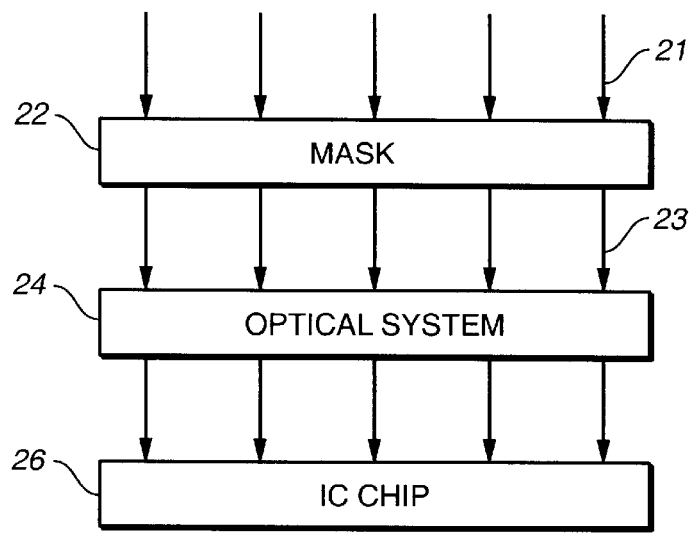
FIG._1
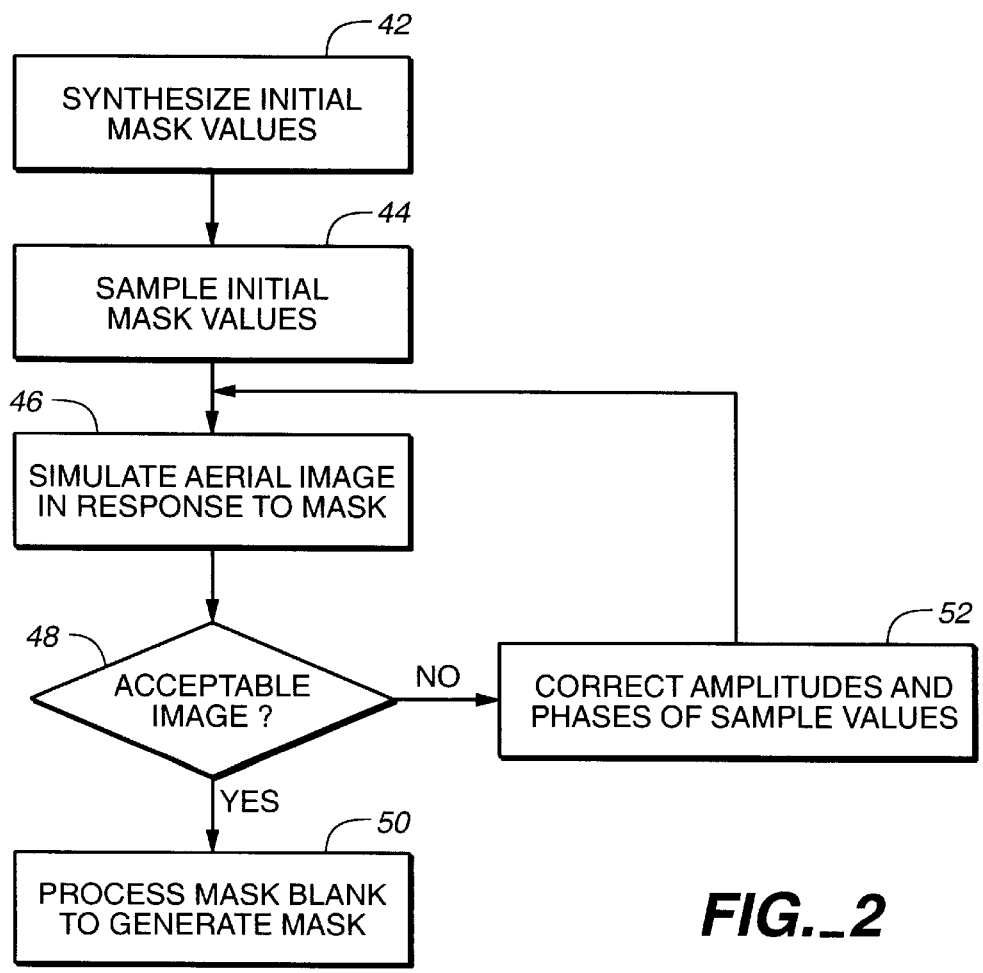
FIG._2

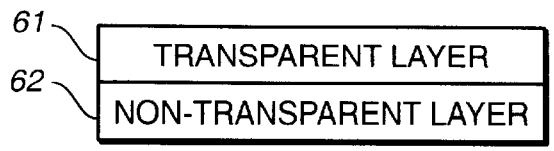
FIG._3A
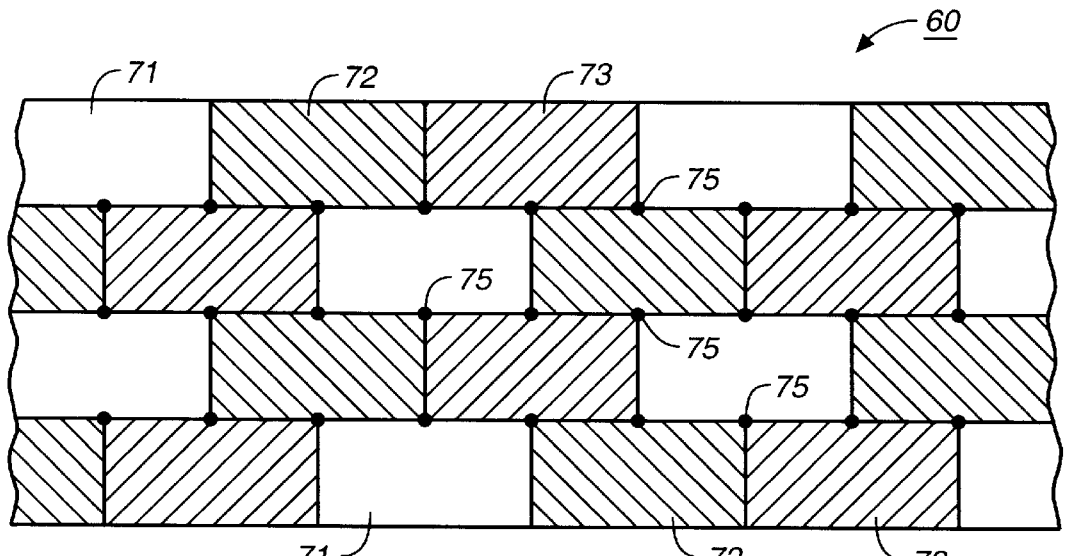
FIG._3B
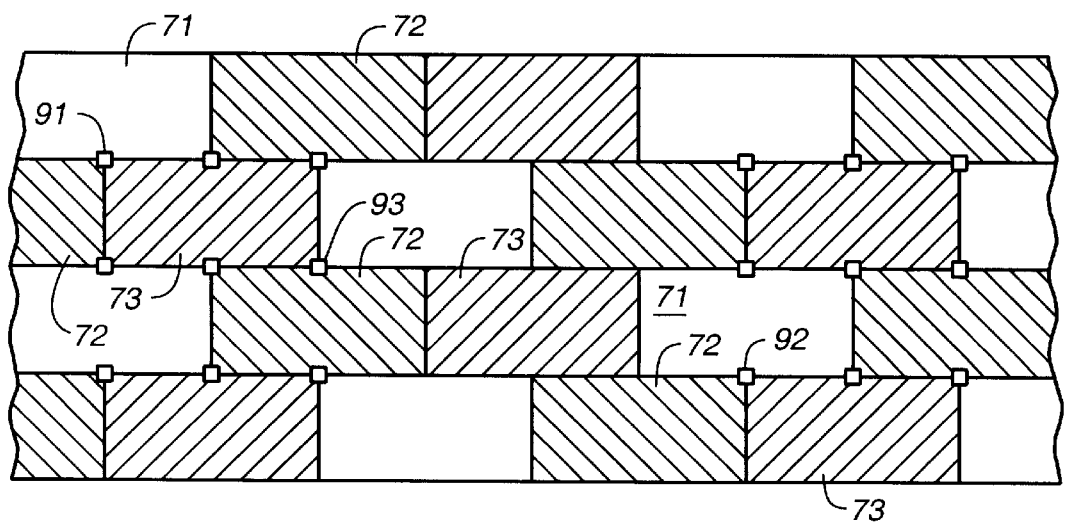
FIG._4

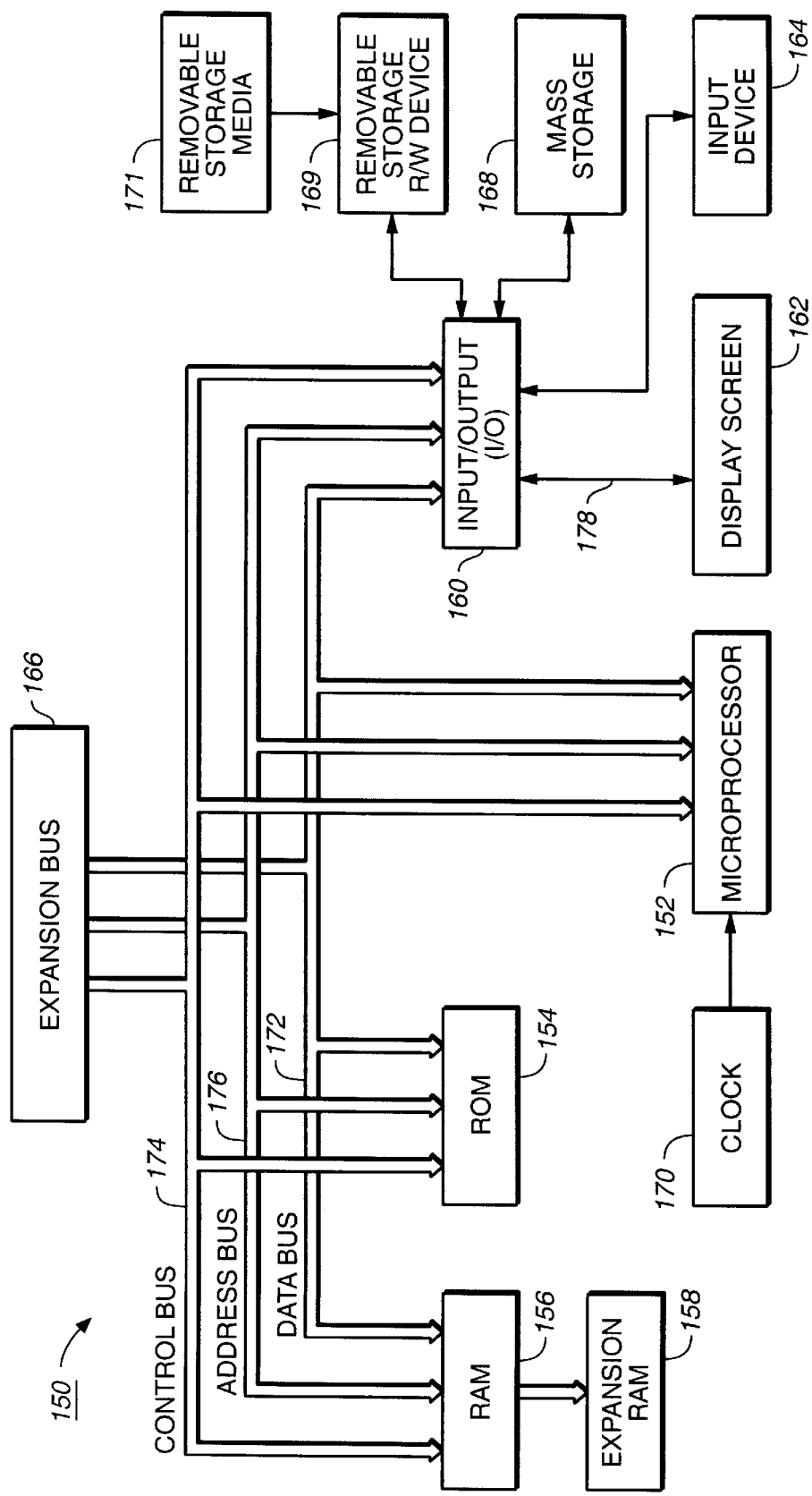
FIG._5

MASK HAVING AN ARBITRARY COMPLEX TRANSMISSION FUNCTION

BACKGROUND OF THE INVENTION

Field of the Invention

The present invention concerns the field of semiconductor wafer fabrication, and particularly relates to a mask with an arbitrary complex transmission function for use in patterning an integrated circuit (IC) chip.

A. Wafer Construction

Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (the wafer is heated and exposed to the desired dopant) and ion implantation (dopant atoms are ionized, accelerated to high velocities and implanted into the wafer surface).

Construction of semiconductor wafers with these steps is well known in the art of semiconductor fabrication. Examples of wafer construction processes are described in U.S. Pat. No. 5,679,598 issued to Yee on Oct. 21, 1997, entitled "Method of Making a CMOS Dynamic Random-Access Memory (DRAM)," U.S. Pat. No. 5,663,076 issued to Rostoker et al. on Sep. 2, 1997, entitled "Automating Photolithography in the Fabrication of Integrated Circuits," U.S. Pat. No. 5,595,861 issued to Garza on Jan. 21, 1997, entitled "Method of Selecting and Applying a Top Antireflective Coating of a Partially Fluorinated Compound," U.S. Pat. No. 5,444,265 issued to Hamilton on Aug. 22, 1995, entitled "Method and Apparatus for Detecting Defective Semiconductor Wafers During Fabrication Thereof," and U.S. Pat. No. 4,652,134 issued to Pasch et al. on Mar. 24, 1987, entitled "Mask Alignment System." The specifications of these five patents identified in this paragraph are hereby incorporated herein as though set forth in full by this reference.

B. Patterning And Proximity Effects

One of the most critical operations in wafer fabrication, patterning sets the dimensions of the electronic devices to be implemented on the IC chip. Errors in the patterning process can cause distortions that cause changes in the functions of these electronic devices.

Design rule limitations frequently are referred to as critical dimensions. A critical dimension of a circuit is commonly defined as the smallest width of a line or the smallest space between two lines. Consequently, the critical dimension determines the overall size and density of an IC. In present IC technology, the smallest critical dimension for state-of-the-art circuits is 0.3 micron for line widths and spacings.

Once the layout of the circuit has been created, the next step to manufacturing the integrated circuit is to transfer the layout onto a semiconductor substrate. Photolithography is a well known process for transferring geometric shapes present on a mask onto the surface of a silicon wafer. In the field of IC lithographic processing, a photosensitive polymer film called photoresist is normally applied to a silicon substrate wafer and then allowed to dry. An exposure tool is utilized to expose the wafer with the proper geometrical patterns through a mask (or reticle) by means of a source of light or radiation. After exposure, the wafer is treated to develop the mask images transferred to the photosensitive material. These masking patterns are then used to create the device features of the circuit.

An important limiting characteristic of the exposure tool is its resolution value. The resolution for an exposure tool is defined as the minimum feature that the exposure tool can repeatedly expose onto the wafer. Currently, the resolution for most advanced optical exposure tools is around 0.2 micron. Thus, the resolution value of present lithographic equipment is close to the critical dimension for most IC circuit designs. Consequently, the resolution of the exposure tool may influence the final size and density of the IC circuit. As the critical dimensions of the layout become smaller and approach the resolution value of the lithographic equipment, the consistency between the masked and actual layout pattern developed in the photoresist is significantly reduced. Specifically, it is observed that differences in pattern development of circuit features depends upon the proximity of the features to one another.

The magnitude of such proximity effects depends on the proximity or closeness of the two features present on the masking pattern. Proximity effects are known to result from optical diffraction in the projection system. This diffraction causes adjacent features to interact with one another in such a way as to produce pattern-dependent variations.

Proximity effects and methods for correcting for them are discussed in U.S. Pat. No. 5,682,323 issued on Oct. 28, 1997, to Pasch et al. entitled "System and Method for Performing Optical Proximity Correction on Macrocell Libraries" (hereinafter the "Pasch '323 patent"). The specification of the Pasch '323 patent is incorporated herein as though set forth in full by this reference. The system and method described in the Pasch '323 patent performs optical proximity correction on an integrated circuit mask design by initially performing optical proximity correction on a library of cells that are used to create the IC. The pre-tested cells are imported onto a mask design. All cells are placed a minimum distance apart to ensure that no proximity effects will occur between elements fully integrated in different cells. An optical proximity correction technique is performed on the mask design by performing proximity correction only on those components, e.g., lines, that are not fully integrated within one cell.

Proximity effects and methods for correcting for them are also discussed in U.S. Pat. No. 5,705,301 issued on Jan. 6, 1998, to Garza et al. entitled "Performing Optical Proximity Correction with the Aid of Design Rule Checkers" (hereinafter the "Garza '301 patent"). The specification of the Garza '301 patent is incorporated herein as though set forth in full by this reference. The system described in the Garza '301 patent involves a method for identifying regions of an integrated circuit layout design where optical proximity correction will be most useful and then performing optical proximity correction on those regions only.

More specifically, the method includes the following steps: (a) analyzing an integrated circuit layout design with a design rule checker to locate features of the integrated circuit layout design meeting predefined criteria; and (b) performing optical proximity correction on the features meeting the criteria in order to generate a reticle design. The criteria employed by the design rule checker to select features include outside corners on patterns, inside corners on features, feature size, feature shape, and feature angles.

C. Proximity Effect Correction

A technique related to proximity effects involves the use of modified shapes or adjacent subresolution geometries to improve imaging. An example of this is the use of serifs on the corners of contacts. For contacts with dimensions near the resolution limit of the optics, a square pattern on the reticle will print more nearly as a circle. Additional geometries on the corners will help to square the corners of the contract. Such techniques often are called proximity correction. An example of such a technique is described in U.S. patent application Ser. No. 09/034,550 filed Mar. 3, 1998 and titled "Method And Apparatus For Application Of Proximity Correction With Relative Segmentation," which application is incorporated by reference herein as though set forth herein in full.

Proximity effects are a well-known phenomenon in electron beam lithography, where they result from electron scattering. In optical lithography proximity effects are caused by the phenomenon of diffraction. As a consequence of proximity effects, printed features do not have simple relationships to reticle dimensions. This creates a situation in which it is difficult to fabricate a photomask where the designer gets what he or she wants on the wafer.

Some limited form of proximity correction has been in use for at least two or three decades. These pattern modifications were usually requested by a wafer engineer based on knowledge of a particular process step. In recent years, proximity correction has become more of a science than an art due to the introduction of several proximity correction software programs. The proximity correction process consists of measuring several generic test patterns processed on a wafer and constructing a multilevel lookup table from the measured data.

D. Phase Shift Masks

The concept of phase shifting masks was first introduced by Levenson in 1982. See M. D. Levenson, N. S. Visnwathan, and R. A. Simpson, "Improving Resolution in Photolithography with a Phase Shift Mask", IEEE Trans. Elec. Dev. ED 26, p. 1828, 1982, which is incorporated herein by reference as though set forth herein in full. Phase shifting often can significantly improve resolution by using destructive (rather than constructive) interference of the tail portions of the diffraction distributions from adjacent features on a mask.

Various techniques have been proposed for phase shift mask fabrication. These conventional techniques ordinarily are implemented in one of two ways. In one, a layer of phase shifting material is added to the mask and then etched to produce the desired phase shift. In the other, the quartz mask itself is etched to a sufficient depth to produce the desired phase shift.

The specific technique originally proposed by Levenson is used in connection with a mask having a diffraction grating. Every other aperture of the diffraction grating is coated by a phase shifting material. The thickness and refractive index of the phase shifting material is sufficient to exactly shift the incident light by 180 degrees with respect to light that does not pass through the phase shifting material. While this technique may work well for simple structures such as a diffraction grating, it generally will not produce optimal results for more complicated patterns.

In another technique proposed to accomplish phase shifting, sometimes called rim phase shifting, phase shifting is performed only near the edges of mask features. This technique also generally will not provide optimal results and can be difficult to implement.

In general, conventional phase shifting masks: (1) are difficult to implement on an application-specific basis and/or (2) do not sufficiently improve resolution in all cases. These drawbacks result in large part from the traditional limitations in the number of different phase shifts which practically can be implemented on a mask, as well as from difficulties in custom-specifying phase shift patterns for each different IC chip to be fabricated.

In this regard, most conventional techniques typically required patterning and then etching the mask for each desired phase shift, typically limiting to one or two the number of different phase shifts which practically could be implemented. Moreover, because the patterning and etching typically had to be customized for each different type of chip to be fabricated, use of phase shifting masks generally has been limited to large scale chip production, such as production of DRAMs. Until now, use of phase shifting masks has been largely impractical for production of application-specific ICs (ASICs).

SUMMARY OF THE INVENTION

The present invention addresses the foregoing problems by providing a mask having a grid defined by points at which three different phase shifting elements meet or having a grid of holes that can overlap three different types of phase-shifting elements.

Thus, according to one aspect, the invention is a mask which has a complex transmission function and which includes a transparent layer and a non-transparent layer. The transparent layer has three types of phase-shifting elements, each imparting a different phase shift relative to the others, with the phase-shifting elements alternating in both x and y dimensions. The non-transparent layer has holes arranged in an approximately equally spaced grid pattern defined by common points in borders of the phase-shifting elements. It is a feature of this aspect of the invention that centers of at least two holes in the non-transparent layer have different offsets from their corresponding common points.

According to a further aspect, the invention is a mask which has a complex transmission function and which includes a transparent layer and a non-transparent layer. The transparent layer has three types of phase-shifting elements arranged such that points common to borders of all three types form a regularly spaced grid. The non-transparent layer has holes coinciding with the points on the grid. It is a feature of this aspect of the invention that each type of phase-shifting element imparts a different phase shift relative to the others, and centers of the holes in the transparent layer have different offsets from the points on the grid.

According to a still further aspect, the invention is a mask which has a complex transmission function and which includes a transparent layer and a non-transparent layer. The transparent layer has three types of phase-shifting elements, each imparting a different phase shift relative to the others. The non-transparent layer has holes arranged in an approximately equally spaced grid pattern. It is a feature of this aspect of the invention that the holes are approximately identical in size and overlap the three types of phase-shifting elements in different combinations.

According to a still further aspect, the invention is a mask blank which includes a transparent layer and a non-transparent layer. The transparent layer has three types of phase-shifting elements arranged such that points common to borders of all three types form a regularly spaced grid, and each type of phase-shifting element imparts a different phase shift relative to the others.

By virtue of the foregoing arrangements, arbitrary complex transmission values generally can be provided at each point in a regularly spaced grid of points, such as by merely slightly altering the positions of holes relative to the grid points. As a result, an arbitrary complex transmission function typically can be provided in a fairly simple manner.

The present invention also addresses the conventional problems by providing a mask blank which has three different types of phase-shifting elements that alternate in both the x and y dimensions.

Thus, according to a still further aspect, the invention is a mask blank which includes a transparent layer and a non-transparent layer. The transparent layer has three types of phase-shifting elements, each imparting a different phase shift relative to the others, with the phase-shifting elements alternating in both x and y dimensions.

By alternating three different types of phase-shifting elements in this manner, the present invention generally provides a mask blank which often can be easily processed, such as by appropriately forming holes in the non-transparent layer, to provide an arbitrary complex transmission function. Moreover, a mask blank according to the present invention typically can be used to create a mask having a complex transmission function for use in patterning an arbitrarily specified ASIC.

The present invention also addresses the problems in the prior art by providing a technique for determining hole positions in a mask blank which will result in a desired complex transmission function.

Thus, according to a still further aspect, the invention is directed to fabrication of a mask having a complex transmission function. A mask blank is obtained having a transparent layer that includes three types of phase-shifting elements, each imparting a different phase shift relative to the others, and also having a non-transparent layer. Then, holes are formed in the non-transparent layer so that, for each hole, the amount that the hole overlaps each type of phase-shifting element is controlled so as to synthesize a desired complex transmission value for the hole.

According to a still further aspect, the invention is directed to designing a mask having at least three types of phase shifting elements so as to implement a desired complex transmission function. Sampled values of the desired complex transmission function are obtained. Then, positions at which to form holes in a layer of the mask are identified so that, for each hole, the amount that the hole overlaps each type of phase-shifting element is controlled so as to synthesize one of the sampled values corresponding to the hole.

Generally, the foregoing techniques can be applied in connection with processing a mask blank to produce a mask having an arbitrary complex transmission function. Moreover, because such processing merely requires forming holes at the identified hole positions, such processing typically will not be more complicated than processing required in conventional techniques to produce a simple binary mask (i.e., zero phase and amplitude of either 0 or 1).

The foregoing summary is intended merely to provide a quick understanding of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 is a functional block diagram illustrating IC chip patterning.

FIG. 2 is a flow diagram for explaining how mask sample values generally are determined according to a representative embodiment of the invention.

FIGS. 3A and 3B illustrate cross-sectional and transparent layer views, respectively, of a mask blank used in the preferred embodiment of the present invention.

FIG. 4 illustrates the mask blank shown in FIG. 3B after processing to achieve a desired complex transmission function, according to the preferred embodiment of the invention.

FIG. 5 illustrates a block diagram of a general purpose computer which is one suitable platform for implementing the methods of the present invention.

DETAILED DESCRIPTION OF THE PREFERRED EMBODIMENT(S)

FIG. 1 is a functional block diagram illustrating a system for patterning an IC chip 26 using a mask 22 that has been fabricated according to the present invention. Referring to FIG. 1, light 21 is incident on mask 22 at a right angle. Such would be the case for a single point light source directly above mask 22 and far enough from mask 22 so that the wavefront at mask 22 would be approximately planar. It should, however, be noted that light 21 is shown in this manner for illustration purposes only. Generally, the light source will be an extended body consisting of many different points and, accordingly, light generally will strike mask 22 at many different angles.

Mask 22 includes transmissive and non-transmissive portions which effectively transmit and block light 21 so as to produce the desired pattern on IC chip 26. According to the present invention, the transmissive portions of mask 22 include holes overlapping several different types of phase shifting elements, with a net effect of providing each hole with an arbitrary transmission amplitude and phase. Manipulating these complex transmission values can result in fine tuning of the destructive interference between diffraction distributions from adjacent mask features.

The light 23 exiting from mask 22 passes through optical system 24 and, finally, contacts IC chip 26, forming the desired pattern. In the preferred embodiment of the invention, optical system 24 merely comprises the distance between mask 22 and IC chip 26. However, in other embodiments, optical system 24 may include one or more lenses, mirrors and/or other optical elements.

A. Mask Design

An overview of a technique for designing a mask with an arbitrary complex transmission function according to the preferred embodiment of the invention will now be described with reference to the flow diagram shown in FIG. 2. Briefly, according to FIG. 2, initial mask values are synthesized; the initial mask values are sampled; an aerial image which would be produced by the mask is simulated; if the image is acceptable, a mask blank is processed to generate the mask according to the sampled mask values; otherwise, the amplitudes and phases of the mask sample values are modified and a new aerial image, based on the corrected values, is simulated.

In more detail, in step 42, initial mask values are synthesized. Preferably, these initial mask values have zero phase, an amplitude of one where the pattern is supposed to appear on the chip, and an amplitude of zero where no pattern is to appear on the chip. However, the initial mask values may be specified in other ways. In particular, the initial values may include serifs and/or predetermined phase shift values, depending upon the particular pattern to be generated.

In step 44, the initial mask values are sampled. Preferably, the sampling is done at equal intervals in the x direction and equal intervals in the y direction. Also, the sampling rate preferably is sufficient to avoid aliasing problems. In this regard, it is noted that the optical system 24 to be used between the mask 22 and the IC chip 26 generally will limit the spatial frequency components which can be imaged on the surface of the IC chip. Thus, the optical system 24 behaves like a low pass filter. Accordingly, utilizing a sufficient sampling rate in conjunction with the low pass filtering effects of the optical system 24 can avoid any aliasing problems. The quantitative considerations in selecting a sufficient sampling rate in the preferred embodiment of the invention are discussed in more detail in section B below.

In step 46, an aerial image which would be produced by a mask having the mask sample values is simulated. For example, the aerial image may be simulated using the techniques described in co-pending U.S. Patent Application titled, "Hybrid Aerial Image Simulation" by Marina Medvedeva, Ranko Scepanovic and Dusan Petranovic, which is being filed on the same date as this application, and which is incorporated by reference herein as though set forth herein in full. Alternatively, any conventional technique for simulating an aerial image may be used to perform this step. In particular, the aerial image may be simulated by processing the mask sample values according to the low pass filtering function defined by equation (4) below and then using equation (1) to simulate the aerial image at the resist plane.

In step 48, it is determined whether the simulated image is acceptable. Preferably, the main criterion in making this determination is whether the simulated image has sufficient resolution to enable patterning which will result in error-free device fabrication. If the image is acceptable, then processing proceeds to step 50 in order to design and produce a mask having the identified complex transmission values. Otherwise, processing proceeds to step 52.

In step 52, the amplitudes and phases of the mask sample values are corrected and, after completion of such correction, processing returns to step 46 in order to simulate an aerial image based on the corrected mask sample values. Various techniques may be utilized in step 52 to correct the mask sample values, with the goal of fine tuning destructive interference between diffraction distributions so as to improve resolution in the image produced in the IC chip 26.

In step 50, a mask blank is processed in order to generate a mask having the mask complex transmission sample values identified in the previous steps. In the preferred embodiment, this step begins with a mask blank 60, as shown in FIGS. 3A and 3B. FIG. 3A illustrates the cross-section of mask blank 60 according to the preferred embodiment of the invention. As shown in FIG. 3A, mask blank 60 includes a transparent layer 61 and a non-transparent layer 62. The transparent layer 61 preferably is comprised of a material such as quartz, although it may instead be another type of material, such as a film deposited on the non-transparent layer 62. The non-transparent layer 62 preferably is comprised of a material such as chrome. The primary mask pattern (i.e., the holes) eventually will be formed in the non-transparent layer 62.

In the preferred embodiment of the invention, transparent layer 61 of mask blank 60 includes three different types of phase-shifting elements. These phase-shifting elements are shown as phase-shifting element types 71, 72 and 73 in FIG. 3B. Also in the preferred embodiment of the invention, each of the three different types of phase-shifting elements produces a phase shift which is $2\Pi/3$ radians different from the other types of phase-shifting elements. More preferably, one of the types of phase-shifting elements has a phase shift of zero (no phase shift), another of the types of phase-shifting elements produces a phase shift of $2\Pi/3$ radians, and the last type of phase-shifting element produces a phase shift of $-2\Pi/3$ radians. Thus, in the present example, phase-shifting element type 71 produces a phase shift of zero, phase-shifting element type 72 produces a phase shift of $2\Pi/3$, and phase-shifting element type 73 produces a phase shift of $-2\Pi/3$.

Also, as shown in FIG. 4, the three different types of different phase-shifting elements meet at points 75. In the preferred embodiment of the invention, points 75 form a regularly spaced grid which coincides with the mask sample positions identified in step 44 above. Thus, it is preferable that the spacings between points 75 in the x and y directions are determined based on a cut-off frequency of the optical system 24 which is intended to be used. In the present embodiment of the invention, the optical system 24 has the same response in both the x and y directions. Accordingly, the spacings between points 75 is the same in the x and y directions. In order to accommodate this spacing pattern, phase-shifting elements 71 to 73 are rectangular in shape and the length of each of the phase-shifting elements 71 to 73 is twice its width. For the same reason, the phase-shifting elements 71 to 73 are arranged in rows, with the three types of phase-shifting elements arranged in a repeating 123 pattern in each row (i.e., 71, 72, 73, 71, 72, 73, . . . ). Also, adjacent rows are offset from each other (in the x direction) one-and-a-half times the length of a phase-shifting element 71 to 73.

Although, the present embodiment of the invention uses a particular configuration of phase-shifting elements in the mask blank, it should be understood that other configurations also are possible. It is preferable, however, that at least three different types of phase-shifting elements meet at a number of common points, with each type of phase-shifting element providing a different phase shift, and with the common points arranged in a regularly spaced grid at an appropriate sampling rate. As discussed in more detail below, such an arrangement will permit the mask designer to implement arbitrary complex transmission values at each of the points 75 merely by appropriately placing a hole (or opening) at such points 75. It should be noted, however, that it is also possible to use a different number of different types of phase-shifting elements in the mask blank (although less than three might limit the range of complex transmission values that are attainable) and/or to use different geometric configurations for and/or different arrangements of the phase-shifting elements.

Techniques for fabricating the phase-shifting elements 71 to 73 on mask blank 70 are well known in the art. One example of such a technique is to first pattern the transparent layer 61 according to the above-described layout of the phase-shifting elements 72 and 73 by using either a laser mask writer or an electron-beam mask writer to write the pattern on a resist on the transparent layer 61. The pattern is then developed on the resist layer and transparent layer 61 is etched to a sufficient depth to produce a $2\Pi/3$ phase shift. After etching, the resist is removed and a new layer of resist deposited. The foregoing patterning, developing and etching process is then repeated, but this time only for the layout pattern of the phase-shifting elements 73. Thus, after completion of the process phase-shifting elements of type 71 will not have been etched at all, and will therefore produce a phase shift of zero; phase-shifting elements of type 72 will have been etched once, and will therefore produce a phase shift of $2\Pi/3$; and phase-shifting elements of type 73 will have been etched twice, and will therefore produce a phase shift of $4\Pi/3$ (i.e., $-2\Pi/3$).

As noted above, using mask blank 60, arbitrary complex transmission values can be implemented at each of the points 75. Specifically, holes (or openings) are formed in non-transparent layer 62 at positions corresponding to points 75. Referring to FIG. 4B, it can easily be seen that if a hole is positioned so as to be exactly centered on one of the points 75, then the hole will overlap all three types of phase-shifting elements 71 to 73. In the particular embodiment shown in FIG. 4B, assuming a symmetric hole, 50 percent of the area of the hole would overlap one of the types of phase-shifting elements and 25 percent of the hole area would overlap each of the other two types of phase-shifting elements, with the type getting 50 percent depending upon the location of the specific point 75. As will be readily appreciated, by shifting the hole position left, right, up or down, the relative contributions of the different types of phase-shifting will be altered, thus varying the amplitude and phase of the complex transmission value. As will be shown below, utilizing the types of phase-shifting elements used in the present embodiment of the invention, any arbitrary complex transmission value can be produced in this manner.

The derivations of equations which can be used for positioning holes to produce an arbitrary complex transmission value are explained in section B below. Depending upon the specific geometry of the holes used, it may be possible to obtain closed form solutions for the hole relative x and y positions as a function of the desired complex transmission value. For more complicated hole geometries, however, it may be necessary to iteratively determine those relative x and y positions. Alternatively, relative x and y positions may be pre-stored in a look-up table for various desired complex transmission values.

In the preferred embodiment of the invention, the holes are approximately square in shape and have an edge length of approximately one-tenth of the hole-to-hole spacing which, in turn, as noted above, preferably is based upon the filtering characteristics of the optical system. Although the holes can be arbitrarily shaped, it is preferable that they have dimensions equal to or smaller than approximately one-tenth of the hole-to-hole spacing. More preferably, the hole dimensions are between approximately one-tenth and approximately one-twentieth of the hole-to-hole spacing.

Methods for forming such holes are well known in the art. One example is to first pattern the non-transparent layer 62 according to the desired hole layout by using either a laser mask writer or an electron-beam mask writer to write the pattern on a resist on the non-transparent layer 62. The pattern is then developed on the resist, and transparent layer 61 etched to actually form the holes according to the developed pattern.

FIG. 4 illustrates mask blank 60 after being processed to implement arbitrary complex transmission values on the grid defined by the points 75. As seen in FIG. 4, different holes are positioned differently relative to their corresponding grid points 75. For example, hole 91 is centered on its corresponding grid point 75. Accordingly, the area of hole 91 is distributed 50% on phase-shifting element type 71, 25% on phase-shifting element type 72, and 25% on phase-shifting element type 73. Hole 92 is positioned so that its area is mostly in phase-shifting element type 72, with only small portions in phase-shifting element types 71 and 73. Hole 93 is positioned so that its area is distributed 50% on phase-shifting element type 71 and 50% on phase-shifting element type 72.

Generally, at least two holes will have different offsets from their respective grid points 75. However, masks according to the present invention may have at least 5, 10, 20, 50 or even 100 holes having different offsets from their respective grid points 75.

B. Mask Design Equations and Theoretical Support

This section will provide equations and describe some of the theoretical support for the above apparatuses and techniques. Assuming that a mask is illuminated by monochromatic radiation of uniform intensity $I_0$, the intensity at an image point $(x_i, y_i)$ is given by:

$$I(x_i,y_i)=I_0\int F(x_0,y_0)K(x_0,y_0,x_i,y_i)B(x_0,y_0,x_i',y_i')F(x_0',y_0')K(x'_0,y'_0,x_i,y_i)dx_0dy_0dx_0'dy_0' \quad (1)$$

where $(x_0,y_0)$ and $(x'_0,y'_0)$ are points in the mask plane, $(x_i,y_i)$ is a point in the image plane, $K(x_0,y_0,x_i,y_i)$ is the coherent point response function of the optical system between the mask point and the image point, $F(x_0,y_0)$ is the complex transmission function of the mask, and $B(x_0,y_0,x_0',y_0')$ is the phase coherence factor between two mask points $(x_0,y_0)$ and $(x'_0,y'_0)$.

Frequencies higher than $k_{max}$ can not pass through the optical system, which practically acts as a filter. In the preferred embodiment of the invention, the cutoff frequency $k_{max}$ generally can be given by:

$$k_{max} = \frac{2\pi}{\lambda} \quad (2)$$

where $\lambda$ is the wavelength of the incident light. It is noted that various other models can be used for describing the optical system cutoff frequency, including models which take account of the numerical aperture of the optical system. However, in most cases, equation (2) provides sufficiently accurate results, particularly for large numerical aperture optical systems.

Mask transmission function $F(x_m,y_m)$ contains frequencies that are higher than $k_{max}$. Since these frequencies can not pass through optical system, the mask transmission function is filtered. The filtration result can be obtained by first finding the Fourier transform of function F, i.e., $$S_k = \Im\{F\} \quad (3)$$

and, then, of multiplying the Fourier transform of F with the transfer function of a low-pass filter. It can be assumed that the filtering effect of the optical system approximates an ideal low pass filter with a cutoff frequency of $k_{max}$, i.e., $$H(k) = \begin{Bmatrix} 1, & |k| < k_{max} \\ 0, & |k| > k_{max} \end{Bmatrix} \quad (4)$$

The above operation is equivalent to the calculation of the following correlation in the spatial domain:

$$F(x_m, y_n) = \int F(x_0, y_0) \sin c[k_{max}(x_0 - m_0\Delta)] \sin c[k_{max}(y_0 - n_0\Delta)] \, dx_0 dy_0 \quad (5)$$

where the mask transmission function is given by samples on a mesh $$(x_m, y_m) = (m_0 \Delta, n_0 \Delta) \quad (6)$$

The maximum step with which the mask transmission function can be sampled to avoid aliasing problems is given by:

$$\Delta = \frac{\pi}{k_{max}} \quad (7)$$

Accordingly, a step which is less than or equal to $\Delta$ preferably is used to sample the mask values in step 44 above, and also preferably is used as the grid spacing in the mask blank described above. Different steps (and different grid spacings) may be used in the x and y directions in the event the optical system has different responses in x and y directions.

The phase shift mask blank described above allows implementation of an arbitrary complex function F, provided $$|F| \leq F_0 < 1 \quad (8)$$

Proof of the foregoing can be shown as follows. Assuming that dimensions of the mask holes (openings) are small compared to $\Delta$, integral (5) can be represented as the following sum of integrals on openings $A_{k1}$ spaced around mesh nodes $(x_k, y_1)$:

$$F(x_m, y_n) = \sum_{k_1} \int_{A_{k1}} F(x_0, y_0) \sin c[k_{max}(x_0 - m_0\Delta)] \sin c[k_{max}(y_0 - n_0\Delta)] \, dx_0 d y_0 \quad (9)$$

In the preferred embodiment, the mask holes are "small" compared to $\Delta$ if their dimensions are not greater than approximately one-tenth of $\Delta$.

Given small openings compared to $\Delta$, it is possible to assume that, at the openings:

$$\int \sin c[k_{max}(x_{0k} - m_0\Delta)] \sin c[k_{max}(y_{0l} - n_0\Delta)] dx_0 dy_0 = \delta_{km}\delta_{ln} \quad (10)$$

so that $$F(x_m, y_m) = \int_{A_{mn}} F(x_0, y_0) d x_0 d y_0 \quad (11)$$

Area $A_{mn}$, in the case described above, consists of three sub-areas, in which $|F|=1$, and the phase is fixed. Thus:

$$A_{mn} = A_{mn}^{(1)} + A_{mn}^{(2)} + A_{mn}^{(3)} \quad (12)$$

and $$F(x_m, y_n) = A_{mn}^{(1)} + A_{mn}^{(2)} e^{i2\frac{\pi}{3}} + A_{mn}^{(3)} e^{-i2\frac{\pi}{3}} \quad (13)$$

It is easy to show that an arbitrary complex function $|F|e^{i\phi}$, where $$|F| = \frac{A_{mn}}{2},$$

can be represented inform (13). In the present embodiment, the sizes of the individual sub-areas can be determined by solving for $A_{mn}^{(1)}$, $A_{mn}^{(2)}$ and $A_{mn}^{(3)}$ using equation (12) in connection with the following two equations:

$$Re\{F\} = A_{mn}^{(1)} - \frac{1}{2}(A_{mn}^{(2)} + A_{mn}^{(3)}) \quad (14)$$

$$Im\{F\} = \sqrt{3}/2(A_{mn}^{(2)} - A_{mn}^{(3)}) \quad (15)$$

For simple hole shapes, information about the geometric shape of the hole to be formed can be combined with equations (12), (14) and (15) to derive equations to determine the hole position necessary to provide any arbitrary complex transmission value, subject to the above magnitude constraint. For more complicated hole shapes, hole positions can be determined iteratively or by using a look-up table.

Similarly, although three types of phase-shifting elements are used in the present embodiment, with relative phase shifts of $2\Pi/3$ radians, any number of different types of phase-shifting elements may instead be used. However, it should be noted that a vertex where at least three different types of phase-shifting elements meet generally will be required to provide an arbitrary complex transmission value, and if only three are used, those three should be independent in the sense that any one of the three can not be formed as a linear combination of the other two. Of course, if other types of phase-shifting elements are instead used, the specific equations, and in particular equations (12), (14) and (15), will have to be modified. However, those modifications will be apparent to one of ordinary skill in the art based on the teachings provided herein. In particular, when the dimensions of the holes are small relative to $\Delta$, the equations for an arbitrary number of different types of phase-shifting elements generally will be derived from the following equations:

$$A_{mn} = \sum_k A_{mn}^{(k)} \quad (16)$$

$$F(x_m, y_n) = \sum_k A_{mn}^{(k)} C_k e^{i\phi_k} \quad (17)$$

where $A_{mn}^{(k)}$ is the area of phase-shifting element type k overlapped by the opening, $C_k$ is the transmission amplitude of phase-shifting element type k (which ordinarily will be one or close to one), and $\phi_k$ is the phase shift of phase-shifting element type k.

C. Mask Design System Environment

Generally, the methods described herein, or portions thereof, will be practiced with a general purpose computer, either with a single processor or multiple processors. Typically, an initial pattern will be supplied in a digitized form. The aerial image simulations, amplitude and phase connections, and hole position identifications will then be performed by a general purpose computer so as to generate an appropriate hole pattern. The generated hole will then be utilized in forming a mask.

FIG. 5 is an illustration of a general purpose computer system, representing one of many suitable computer platforms for implementing the inventive methods described above. FIG. 5 shows a general purpose computer system 150 in accordance with the present invention includes a central processing unit (CPU) 152, read only memory (ROM) 154, random access memory (RAM) 156, expansion RAM 158, input/output (I/O) circuitry 160, display assembly 162, input device 164, and expansion bus 166. Computer system 150 may also optionally include a mass storage unit 168 such as a disk drive unit or nonvolatile memory such as flash memory and a real-time clock 170.

CPU 152 is coupled to ROM 154 by a data bus 172, control bus 174, and address bus 176. ROM 154 contains the basic operating system for the computer system 150. CPU 152 is also connected to RAM 156 by busses 172,174, and 176. Expansion RAM 158 is optionally coupled to RAM 156 for use by CPU 152. CPU 152 is also coupled to the I/O circuitry 160 by data bus 172, control bus 174, and address bus 176 to permit data transfers with peripheral devices.

I/O circuitry 160 typically includes a number of latches, registers and direct memory access (DMA) controllers. The purpose of I/O circuitry 160 is to provide an interface between CPU 152 and such peripheral devices as display assembly 162, input device 164, and mass storage 168.

Display assembly 162 of computer system 150 is an output device coupled to I/O circuitry 160 by a data bus 178. Display assembly 162 receives data from I/O circuitry 160 via bus 178 and displays that data on a suitable screen.

The screen for display assembly 162 can be a device that uses a cathode-ray tube (CRT), liquid crystal display (LCD), or the like, of the types commercially available from a variety of manufacturers. Input device 164 can be a keyboard, a mouse, a stylus working in cooperation with a position-sensing display, or the like. The aforementioned input devices are available from a variety of vendors and are well known in the art.

Some type of mass storage 168 is generally considered desirable. However, mass storage 168 can be eliminated by providing a sufficient mount of RAM 156 and expansion RAM 158 to store user application programs and data. In that case, RAMs 156 and 158 can optionally be provided with a backup battery to prevent the loss of data even when computer system 150 is turned off. However, it is generally desirable to have some type of long term mass storage 168 such as a commercially available hard disk drive, nonvolatile memory such as flash memory, battery backed RAM, PC-data cards, or the like.

A removable storage read/write device 169 may be coupled to I/O circuitry 160 to read from and to write to a removable storage media 171. Removable storage media 171 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 150 by typing on a keyboard, manipulating a mouse or trackball, or "writing" on a tablet or on position-sensing screen of display assembly 162. CPU 152 then processes the data under control of an operating system and an application program stored in ROM 154 and/or RAM 156. CPU 152 then typically produces data which is outputted to the display assembly 162 to produce appropriate images on its screen.

Expansion bus 166 is coupled to data bus 172, control bus 174, and address bus 176. Expansion bus 166 provides extra ports to couple devices such as network interface circuits, modems, display switches, microphones, speakers, etc. to CPU 152. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations, or personal computers. In addition, although a general purpose computer system has been described above, a special-purpose computer may also (or instead) be used to implement the methods of the present invention.

It should be understood that the present invention also relates to machine readable media on which are stored reticle designs meeting the requirements of this invention, or program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

D. Conclusion

The present invention thus overcomes many of the problems in the prior art by utilizing a mask blank which can be prepared in advance and then processed to provide an arbitrary complex transmission function merely by appropriately forming holes in a non-transparent layer of the mask blank. Specifically, the mask blank pattern is only dependent upon factors that are independent of the individual chip being fabricated, such as the wavelength of the exposure light and possibly characteristics of the optical system. Accordingly, the mask blank can be designed and fabricated in advance for a number of different ASICs. Because customization of the mask blank merely involves etching portions of the non-transparent layer, it is not significantly different than customization of a mask blank for an ordinary binary amplitude mask. As a result, the present invention can make phase shifting masks practical for producing ASICs. Moreover, the phase shifting masks according to the present invention can have arbitrary complex transmission functions, while requiring formation of only two additional phase shifting elements (i.e., on the existing zero phase shift substrate). As noted above, in most conventional phase shifting masks, the number of possible phase shifts generally was limited to the number of phase shifting elements formed on the mask.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A mask having a complex transmission function, comprising:

a transparent layer having three types of phase-shifting elements, each imparting a different phase shift relative to the others, with the phase-shifting elements alternating in both x and y dimensions; and a non-transparent layer having holes arranged in an approximately equally spaced grid pattern defined by common points in borders of the phase-shifting elements, wherein centers of at least two holes in the non-transparent layer have different offsets from their corresponding common points.

2. A mask according to claim 1, wherein the three types of phase-shifting elements produce phase shifts that are offset from each other by approximately 2Π/3 radians.

3. A mask according to claim 1, wherein the holes have approximately equal sizes and approximately identical shapes.

4. A mask according to claim 1, wherein dimensions of the holes are between approximately one-tenth and one-twentieth of spacing between the common points.

5. A mask according to claim 1, wherein the phase-shifting elements are arranged in rows, wherein the three types are arranged in a repeating 123 pattern in each row, and wherein the repeating 123 patterns in each two adjacent rows are offset by approximately 1.5 phase-shifting elements.

6. A mask having a complex transmission function, comprising:

a transparent layer having three types of phase-shifting elements arranged such that points common to borders of all three types form a regularly spaced grid; and a non-transparent layer having holes coinciding with the points on the grid, wherein each type of phase-shifting element imparts a different phase shift relative to the others, and wherein centers of the holes in the transparent layer have different offsets from the points on the grid.

7. A mask according to claim 6, wherein the three types of phase-shifting elements produce phase shifts that are offset from each other by approximately 2Π/3 radians.

8. A mask according to claim 6, wherein the holes have approximately equal sizes and approximately identical shapes.

9. A mask according to claim 6, wherein dimensions of the holes are between approximately one-tenth and one-twentieth of spacing between the points on the grid.

10. A mask according to claim 6, wherein the phase-shifting elements are approximately rectangular in shape and are arranged in rows, wherein the three types are arranged in a repeating 123 pattern in each row, and wherein the repeating 123 patterns in each two adjacent rows are offset by approximately 1.5 phase-shifting elements.

11. A mask having a complex transmission function, comprising:

a transparent layer having three types of phase-shifting elements, each imparting a different phase shift relative to the others; and a non-transparent layer having holes arranged in an approximately equally spaced grid pattern, wherein the holes are approximately identical in size and overlap the three types of phase-shifting elements in different combinations.

12. A mask according to claim 11, wherein the three types of phase-shifting elements produce phase shifts that are offset from each other by approximately 2Π/3 radians.

13. A mask according to claim 12, wherein the three types of phase-shifting elements produce phase shifts of approximately 0, 2Π/3 radians and −2Π/3 radians, respectively.

14. A mask according to claim 11, wherein the holes have approximately identical shapes.

15. A mask according to claim 11, wherein the grid pattern is defined by points that are common to borders of at least three different types of phase-shifting elements.

16. A mask according to claim 15, wherein dimensions of the holes are between approximately one-tenth and one-twentieth of spacing between the points that are common to borders of at least three different types of phase-shifting elements.

17. A mask according to claim 11, wherein the phase-shifting elements are arranged in rows, wherein the three types are arranged in a repeating 123 pattern in each row, and wherein the repeating 123 patterns in each two adjacent rows are offset by approximately 1.5 phase-shifting elements.

18. A method for fabricating a mask having a complex transmission function, said method comprising:

obtaining a mask blank having a transparent layer that includes three types of phase-shifting elements, each imparting a different phase shift relative to the others, and also having a non-transparent layer; and forming holes in the non-transparent layer so that, for each hole, the amount that said each hole overlaps each type of phase-shifting element is controlled so as to synthesize a desired complex transmission value for said each hole.

19. A method according to claim 18, wherein the holes are formed in a regularly spaced grid pattern in the non-transparent layer.

20. A method according to claim 19, wherein the grid pattern is defined by points that are common to borders of at least three different types of phase-shifting elements.

21. A method according to claim 20, wherein dimensions of the holes are between approximately one-tenth and one-twentieth of spacing between the points that are common to the borders of at least three different types of phase-shifting elements.

22. A method according to claim 19, wherein the mask is for use in patterning an integrated circuit (IC) chip and is intended to be used in conjunction with an optical system disposed between said mask and said IC chip, and wherein spacing between points in the grid pattern is not greater than approximately $\Pi/k_{max}$, where $k_{max}$ is a spatial frequency cutoff of the optical system.

23. A method according to claim 18, wherein the desired complex transmission value for said each hole is synthesized by adjusting an amount of overlap of each type of phase-shifting element until $$F(x_m, y_n) = \sum_k A_{mn}^{(k)} e^{i\phi_k},$$

where $F(x_m, y_n)$ is the desired complex transmission value for said each hole, $A_{mn}^{(k)}$ is an amount of area said each hole overlaps phase-shifting element type k, and $\phi_k$ is a phase shift imparted by phase-shifting element type k.

24. A method according to claim 18, wherein the three types of phase-shifting elements produce phase shifts that are offset from each other by approximately 2Π/3 radians.

25. A method according to claim 24, wherein the three types of phase-shifting elements produce phase shifts of approximately 0, 2Π/3 radians and −2Π/3 radians, respectively.

26. A method according to claim 18, wherein the holes have approximately identical sizes and approximately identical shapes.

27. A method according to claim 18, wherein the phase-shifting elements are arranged in rows, wherein the three types are arranged in a repeating 123 pattern in each row, and wherein the repeating 123 patterns in each two adjacent rows are offset by approximately 1.5 phase-shifting elements.

28. A mask blank comprising:

a transparent layer having three types of phase-shifting elements, each imparting a different phase shift relative to the others, with the phase-shifting elements alternating in both x and y dimensions; and a non-transparent layer.

29. A mask blank comprising:

a transparent layer having three types of phase-shifting elements arranged such that points common to borders of all three types form a regularly spaced grid; and a non-transparent layer, wherein each type of phase-shifting element imparts a different phase shift relative to the others.

\* \* \* \* \*